United States Patent
Tatah

(10) Patent No.: US 6,180,912 B1
(45) Date of Patent: Jan. 30, 2001

(54) FAN-OUT BEAMS FOR REPAIRING AN OPEN DEFECT

(75) Inventor: Adbelkrim Tatah, Arlington, MA (US)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/052,774

(22) Filed: Mar. 31, 1998

(51) Int. Cl.⁷ .............................. B23K 26/00; B05C 5/00
(52) U.S. Cl. ................................ 219/121.6; 219/121.77; 427/555
(58) Field of Search ...................... 219/121.73, 121.25, 219/121.77, 121.6, 121.85; 427/555

(56) References Cited

U.S. PATENT DOCUMENTS

| | | |
|---|---|---|
| 3,560,258 | 2/1971 | Brisbane . |
| 3,781,978 | 1/1974 | Intrator et al. . |
| 4,349,583 | 9/1982 | Kulynych et al. . |
| 4,432,855 | 2/1984 | Romankiw et al. . |
| 4,622,058 | 11/1986 | Leary-Renick et al. . |
| 4,714,628 | 12/1987 | Eloy . |
| 4,725,877 | 2/1988 | Brasen et al. . |
| 4,734,550 | 3/1988 | Imamura et al. . |
| 4,752,455 | 6/1988 | Mayer . |
| 4,758,388 | 7/1988 | Hamada et al. . |
| 4,832,798 | 5/1989 | Cvijanovich et al. . |
| 4,895,735 | 1/1990 | Cook . |
| 4,933,204 | 6/1990 | Warren, Jr. et al. . |
| 4,964,698 * | 10/1990 | Rowlette ................................ 359/15 |
| 4,987,006 | 1/1991 | Williams et al. . |
| 4,987,007 | 1/1991 | Wagal et al. . |
| 5,057,184 | 10/1991 | Gupta et al. . |
| 5,079,070 | 1/1992 | Chalco et al. . |
| 5,141,602 | 8/1992 | Chen et al. . |
| 5,153,408 | 10/1992 | Handford et al. . |
| 5,168,454 | 12/1992 | LaPlante et al. . |
| 5,173,441 | 12/1992 | Yu et al. . |
| 5,175,504 | 12/1992 | Henley . |
| 5,177,594 | 1/1993 | Chance et al. . |
| 5,203,929 | 4/1993 | Takayanagi et al. . |
| 5,235,272 | 8/1993 | Henley . |
| 5,246,745 | 9/1993 | Baum et al. . |
| 5,330,968 | 7/1994 | Nagaishi et al. . |
| 5,492,861 | 2/1996 | Opower . |
| 5,567,336 * | 10/1996 | Tatah ........................... 219/121.85 X |
| 5,683,601 | 11/1997 | Tatah . |

* cited by examiner

Primary Examiner—Samuel M. Heinrich
(74) Attorney, Agent, or Firm—Ratner & Prestia

(57) ABSTRACT

An apparatus for metal line deposition and a method for metal line deposition using the apparatus. A donor plate has a donor substrate transparent to a focused coherent light beam. The donor plate has a donor surface coated with a metallic material. The donor plate is positioned so the coated donor surface is adjacent a deposition substrate. A focused coherent light beam is diffracted to form a plurality of coherent light beams. The plurality of beams are directed through the donor substrate and arranged along a line on the metallic material coating the donor surface. The plurality of beams cause the metallic material to ablate from the donor surface by discharging ions of the metallic material away from the donor plate and onto the deposition substrate to form the metal line. Either the plurality of beams or the donor plate and deposition plate are actuated so the metallic material is ablated from the donor plate in a direction parallel to the metal line to be deposited.

5 Claims, 6 Drawing Sheets

FAN-OUT BEAMS FOR REPAIRING AN OPEN DEFECT

FIELD OF THE INVENTION

This invention relates to metal line deposition and, in particular, to laser ablation forward metal line deposition using a fan-out beam.

BACKGROUND OF THE INVENTION

Metal lines are commonly used for connecting circuits in printed circuit boards and multichip modules. Existing metal line deposition techniques include laser chemical vapor deposition and laser deposition from metal precursors. These techniques, however, have certain disadvantages associated with them. Chemical vapor deposition processes require toxic gases and a vacuum chamber. Deposition from metal precursors requires wet processing that can damage or introduce defects in the surrounding circuitry.

A less expensive and more environmentally friendly metal deposition technique is laser ablation. Laser ablation of metal films in general is a known technique wherein a laser beam is focused onto the metal film. The heat and shock wave generated by the laser beam remove, or discharge, particles of the film. Thin films of metals such as copper, gold, silver and aluminum may be easily removed, or ablated, using green light lasers, such as Q-switched doubled Nd:YAG, Nd:YLF, or copper vapor lasers.

One such laser ablation technique involves the use of pulsed-laser deposition in order to layer complex thin films on substrates. Using this technique, a focused laser beam is directed onto a target film at an angle. The plume of particles that are ablated from the film land on a substrate that is positioned parallel to the target. The particles are thus deposited onto the substrate to form a thin epitaxial coating. Both the substrate and the target are contained in a vacuum environment in this technique.

SUMMARY OF THE INVENTION

The present invention provides an apparatus and a method for metal line deposition. A donor plate has a donor substrate transparent to a focused coherent light beam. The donor plate has a donor surface coated with a metallic material. The donor plate is positioned so the coated donor surface is adjacent a deposition substrate. A focused coherent light beam is diffracted to form a plurality of coherent light beams. The plurality of beams are directed through the donor substrate and arranged along a line on the metallic material coating the donor surface. The plurality of beams cause the metallic material to ablate from the donor surface by discharging ions of the metallic material away from the donor plate and onto the deposition substrate to form the metal line. Either the plurality of beams or the donor plate and deposition plate are actuated so the metallic material is ablated from the donor plate in a direction parallel to the metal line to be deposited.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

In this invention, laser ablation is used to deposit metal lines on substrates by the ablation of a metal film from a donor plate, in a dry process that does not require a vacuum. A plurality of coherent light beams are used to ablate the metal film from the donor plate. In addition, an electric field may be applied across the donor plate being ablated and the substrate onto which the metal lines are deposited to drive the ablated metal ions toward the deposition location and to electrostatically bond the metal ions to the surface of the substrate.

Figure 1:
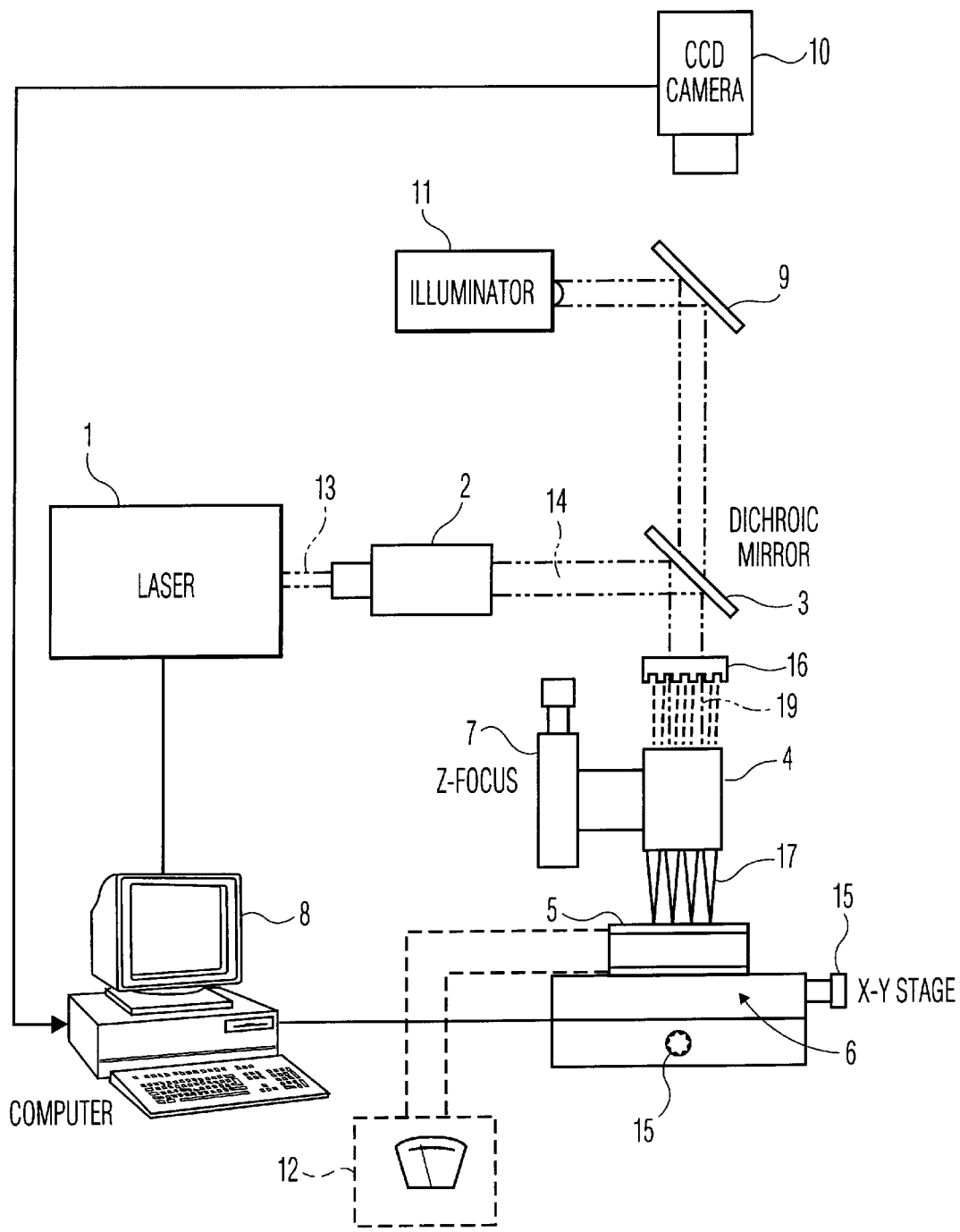
FIG. 1 is a side plan view of laser metal deposition apparatus according to an exemplary embodiment of the present invention.

FIG. 1 illustrates an exemplary laser metal deposition apparatus according to the present invention. A laser 1 is a harmonically doubled solid state Q-switched Nd:YLF or Nd:YAG laser, available from Continuum Inc., in Santa Clara, Calif. The laser beam 13 from the laser 1 is expanded by a telescope 2 into an expanded beam 14. The expanded beam 14 shines on a dichroic mirror 3 which directs the expanded beam 14 into a diffractive element 16. The diffractive element 16 converts the expanded beam 14 into a plurality of parallel beams 19. The plurality of parallel beams 19 are directed into the objective lens 4. The objective lens focuses the plurality of parallel beams 19 to provide a plurality of focused parallel beams 17. A focusing mechanism 7 is used to adjust the focus of the plurality of focused parallel beams 17 provided by the objective lens 4. The objective lens 4 focuses the plurality of focused parallel beams 17 to a diffraction limit spot on a sample 5. An optional power supply 12 may be used to create an electric field across the sample 5. The location of the diffractive element 16 is not limited to that depicted in the exemplary embodiment of FIG. 1. For example, the diffractive element 16 may also be positioned between the telescope 2 and the dichroic mirror 3.

In the exemplary embodiment shown in FIG. 1, illuminator 11 provides light that is deflected by mirror 9 onto dichroic mirror 3. Illuminator 11 is used as a white light source to illuminate sample 5 so the process and location of the focused beam can be monitored. A suitable illuminator is available from Edmund Scientific Company in Barrington, N.J.

Also, in the exemplary embodiment, CCD camera 10 is used to image and monitor the process location. The image is fed to computer 8 which computes subsequent process locations based on a programmed path. Any state of the art video camera is suitable for this purpose. When repairing metal lines, the image from the CCD camera 10 may also be used to identify the location of defects in metal lines to repair.

Sample 5 is supported on stage 6. Stage 6 is equipped with X-Y motion controls 15 that are controlled by computer 8. Suitable motion controls and computer are available from New England Affiliated Technologies in Lawrence, Mass., and comprise, for example, an XY-8080 precision stage, a PCX2 controller, and a 202M microstepping drive, with the controller interfaced to a 486 IBM PC or compatible.

Computer 8 also controls the power of laser 1. By adjusting the position of stage 6 and the power of laser 1, computer 8 enables the deposition of specific patterns on sample 5.

Figure 2:
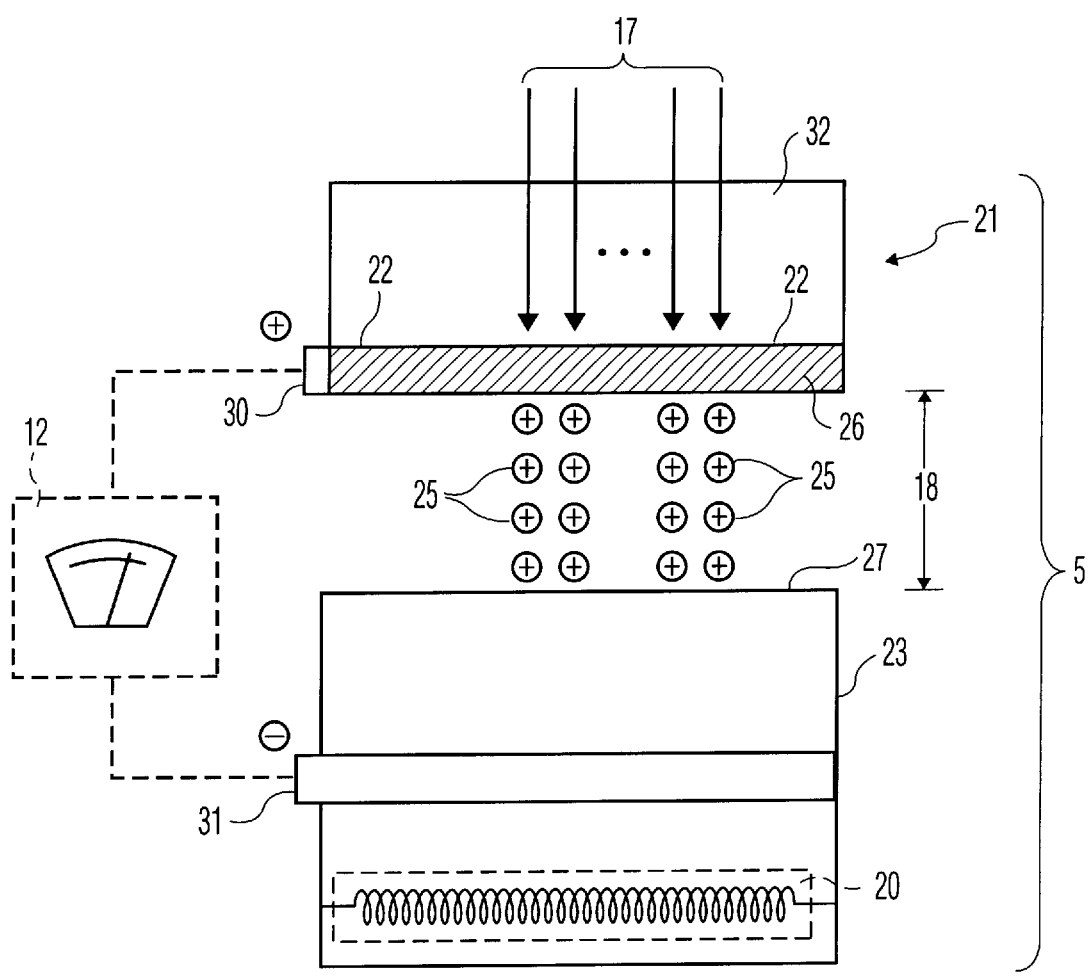
FIG. 2 is a side plan view illustrating laser ablation according to the present invention.

FIG. 2 illustrates laser ablation of a sample 5 according to the present invention. The sample 5 includes a donor plate 21 and a deposition substrate 23. The donor plate 21 includes a donor substrate 32 and a donor surface 22 coated with a metallic material 26. The donor substrate 32 is transparent to the plurality of focused parallel beams 17. In an exemplary embodiment, the donor substrate 32 is glass. In an exemplary embodiment, the metallic material 26 is copper, gold, aluminum or silver.

As shown in FIG. 2, the deposition substrate 23 has a deposition surface 27 upon which a metal line is to be deposited. The deposition substrate 23 is disposed so the deposition surface 27 is adjacent the metallic material 26 of the donor plate 21. In an exemplary embodiment, the deposition substrate 23 is glass.

The plurality of focused parallel beams 17 pass through the donor substrate 32 of the donor plate 21 and impinge on the metal coating 26 on the donor surface 22. The contact of the plurality of focused parallel beams 17 with the metal coating 26 results in ablation of the metal coating 26. During ablation, metal ions 25 accelerate away from the metal coating 26. As metal ions 25 accelerate away from the donor plate 21, the metal ions 25 contact the deposition substrate 23 to form a metal line. The metal ions 25 accelerate away from the donor plate 21 due to the laser ablation-generated acoustic shock waves.

The spacing 18 between the donor plate 21 and the deposition substrate 23 may be adjusted to vary the feature size (width) of the resulting metal lines on the deposition substrate 23. As the spacing 18 increases, the feature size of the deposited metal lines increases.

The thickness of the coating of metal material 26 on the donor surface 22 may be varied to change the thickness of the metal lines deposited onto the deposition substrate 23. A thicker coating of metallic material 26 allows more metal ions 25 to be ablated. This produces a thicker metal line.

As shown in FIG. 2, in an exemplary embodiment, an electric field may be applied between the donor plate 21 and the deposition substrate 23 using optional power supply 12. Power supply 12 has a positive electrode 30 attached to the metallic material 26. A negative electrode 31 is connected to deposition substrate 23. Preferably, the voltages applied across the electrodes 30, 31 are at least 300 volts. When using an electric field, the metal ions 25 are driven toward the deposition plate 23 by an electrostatic force due to the electric field in addition to the laser ablation-generated acoustic shock waves.

The electric field applied across the donor plate 21 and the deposition substrate 23 also assists the bonding of metal ions 25 to the deposition substrate 23. Because of the contact of the negative electrode with the deposition substrate 23, the positive ions such as sodium ions in the deposition substrate 23 migrate away from the deposition surface 27 toward the negative electrode 31. This leaves behind negative ions such as oxygen in the deposition substrate 23. These negative ions electrostatically bond with the positive metal ions 25 that contact the deposition surface 27. A permanent chemical seal due to a thin metal oxide layer is formed after the electric field is removed. Conducting metal lines can thus be formed on deposition surface 27 of the deposition substrate 23 from metal ions 25.

As shown in FIG. 2, an optional hot plate 20 may be used to augment the migration of positive ions within the deposition substrate 23 to the negative electrode 31 and thus enhance the bonding of metal ions 25 to the deposition surface 27 of the deposition substrate 23. The heat increases the diffusion and allows for greater mobility of the ions in the deposition substrate 23.

By adjusting stage controls 15 and the power of laser 1, computer 8 enables movement of stage 6, and hence sample 5, under the plurality of focused parallel beams 17. This allows metal line patterns to be written on sample 5. Alternatively, the plurality of focused parallel beams 17 can be moved with a scanner (not shown) and a scanning lens (not shown) with the sample 5 held stationary under the focused plurality of parallel beams 17. This invention is not limited to the method of positioning the sample 5 with respect to the focused plurality of parallel beams 17 as described above. Other positioning methods and apparatus are known to those skilled in the art such as that described by LaPlante et al. in U.S. Pat. No. 5,168,454, incorporated herein by reference for its teachings on laser assisted machining. LaPlante et al. teach how to position and scan a laser on a workpiece by using a rotating polygonal mirror to scan a single beam along a first axis 62 and translating the workpiece along a second axis using a translation table 61.

Figure 3:
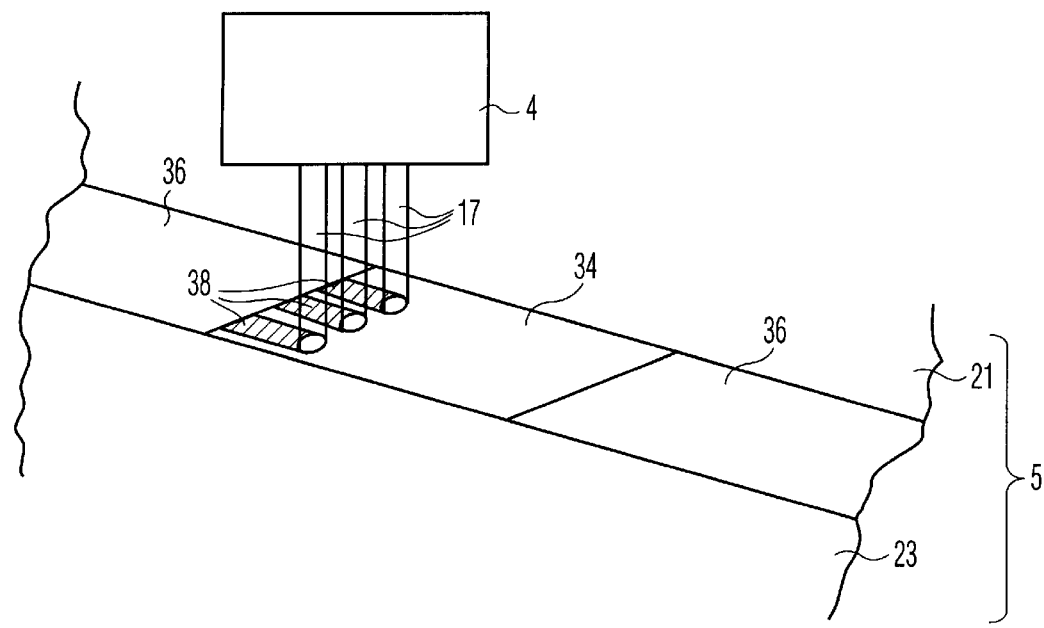
FIG. 3 is a perspective view of an apparatus according to the present invention.

FIG. 3 illustrates an example of the repair of a metal line using the teachings of the present invention. A gap 34 in a metal line 36 is being repaired. The focused plurality of parallel beams 17 are scanned across the gap 34 to deposit metal traces 38 on the deposition substrate 23 to repair the metal line 36.

Figure 4:
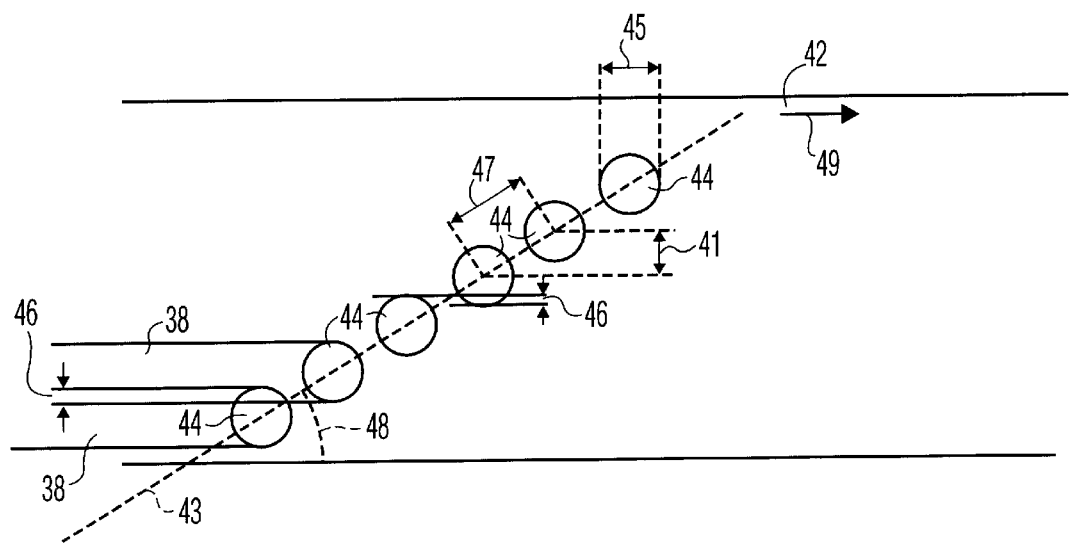
FIG. 4 is a top view of a plurality of beams arranged with respect to a metal line to be deposited according to the present invention.

FIG. 4 is a top view of a plurality of beams arranged with respect to a metal line 42 to be deposited according to the present invention. Each of the focused plurality of parallel beams 17 generates a beam area 44 upon the metallic material 26 on the donor surface 22 of the donor plate 21. In FIG. 4, the beam areas 44 are shown superimposed upon the metal line 42 to be deposited. Each beam area 44 has a beam width 45. The line 43 of beams 44 is oriented at an angle 48 with respect to the metal line 42 to be deposited. The beam areas 44 are located a distance 47 apart from each adjacent beam area 44.

When the focused plurality of parallel beams 17 are scanned along the metal line 42 to be deposited at an angle 48 with respect to the direction 49 of scanning along the metal line 42, metal traces 38 are formed corresponding to respective beam areas 44. The distance 41 is the distance between the centers of adjacent beam areas 44 taken along the width of the metal line 42 when the beam areas 44 are scanned in a direction 49 along the metal line 42. In an exemplary embodiment, the distance 47 and angle 48 are chosen to result in an overlap between adjacent metal traces 38 by a distance 46. The size and arrangement of beam areas 44 may be chosen to achieve the desired characteristics of the metal line to be deposited as described below.

As shown in FIG. 4, by arranging the beam areas 44 along a line 43 at an angle 48, multiple overlapping metal traces 38 may be deposited concurrently while minimizing optical interference between adjacent beams, since the distance 47 between beams is greater than the beam width 45. Concurrent metal trace 38 deposition also provides a speed advantage over scanning a single beam back and forth until the entire width of the metal line 42 has been deposited.

Figure 5:
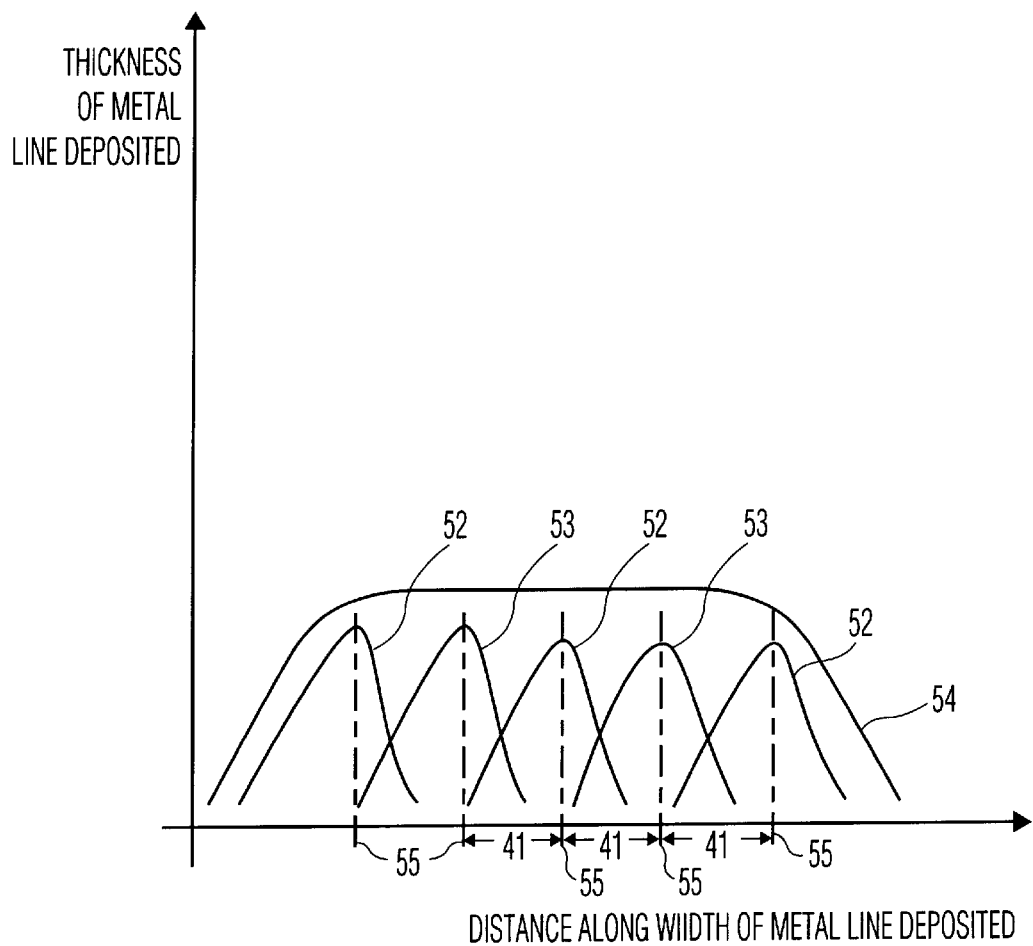
FIG. 5 illustrates the formation of a uniform thickness metal line using a plurality of beams according to the present invention.

FIG. 5 illustrates the thickness of a metal line formed according to the present invention. The thickness of metal deposited due to each beam area 44 is approximated in FIG. 5 by Gaussian distributions 52, 53 centered upon beam area centers 55 taken along the width of a metal line to be deposited. Each distribution 52, 53 is a distance 41 apart from an adjacent distribution 52, 53. Curve 54 represents the sum of the distributions 52, 53 which represents the thickness of the metal line deposited on a deposition substrate 23 according to the present invention.

Figure 6:
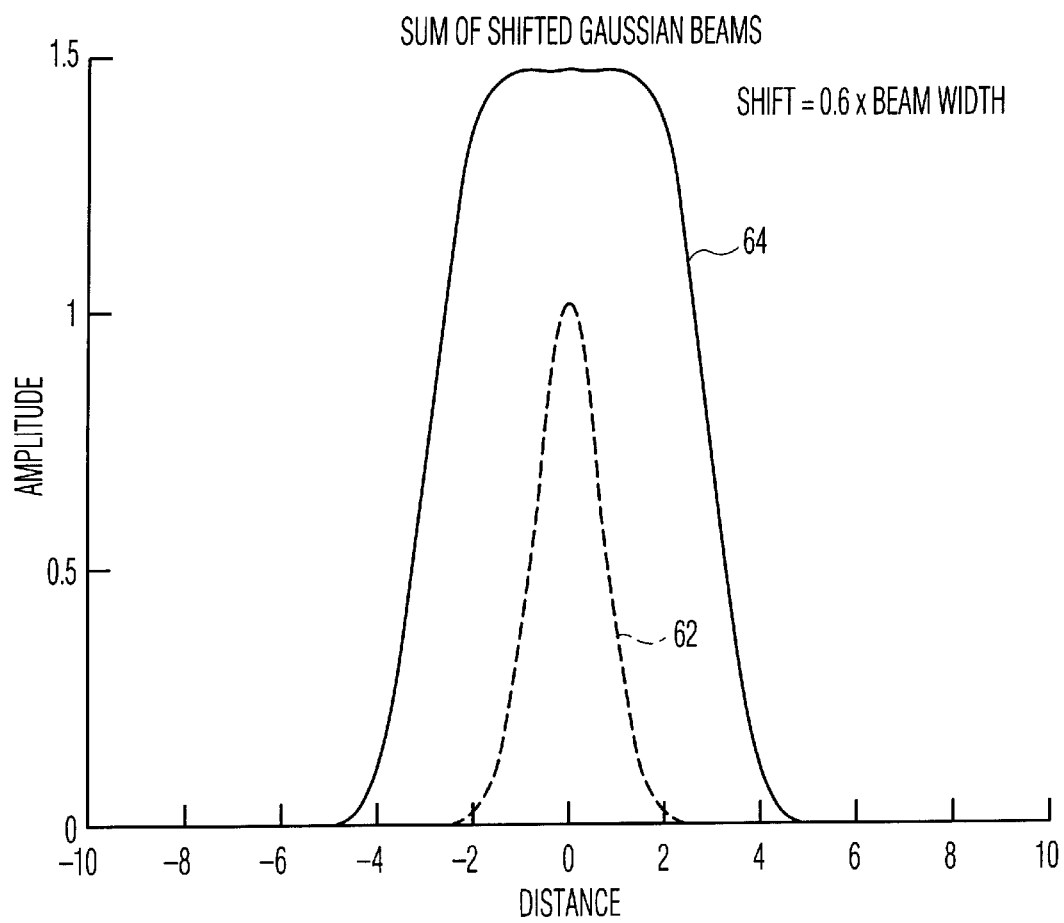
FIG. 6 illustrates the formation of metal line using a plurality of beams.

FIG. 6 illustrates the thickness of a metal line formed according to an exemplary embodiment of the present invention. Curve 62, centered on distance "0", represents the distribution of deposited metal corresponding to a single beam area 44. Curve 64 represents the thickness of a metal line deposited due to the distribution of curve 62 and two similar distributions (not shown) centered on distances "−2" and "2" respectively. In this exemplary embodiment, the distance 41 between beam centers along the width of a metal line to be deposited is equal to 0.6 times the beam width 45. With a beam having a beam energy with a Gaussian distribution, the beam width 45 in this exemplary embodiment is equal to the distance from $[-\sigma, +\sigma]$ where $\sigma$ is the standard deviation of the beam energy distribution. Thus, due to the angle 48, the paths traced by the beams over the metal during the deposition process overlap by 0.4 times the beam width.

Figure 7:
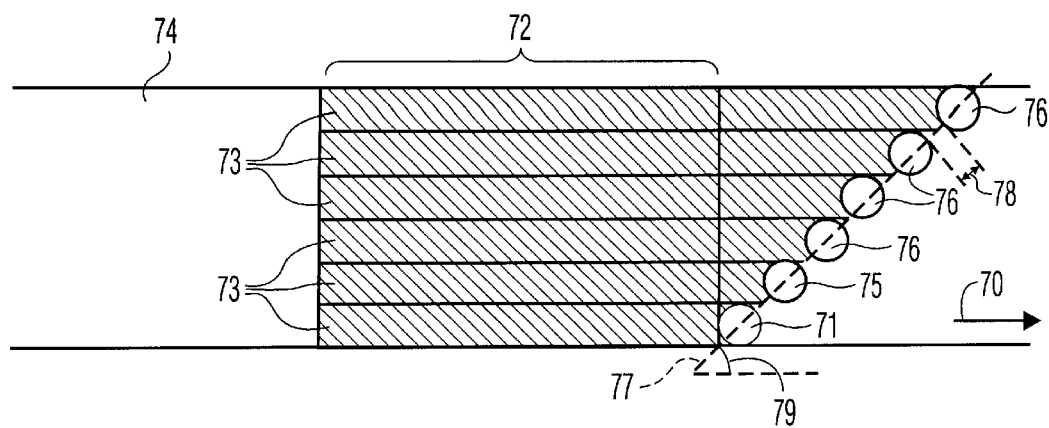
FIGS. 7 and 8 show methods of repairing a metal line according to an exemplary embodiment of the present invention.

FIG. 7 shows the repair of a gap 72 in a metal line 74. As shown in FIG. 7, a focused plurality of parallel beams forms a line of beam areas 71, 75, 76. Each of the beams areas 71, 75, 76 is a distance 78 away from adjacent beam areas 71, 75, 76. Each beam area 71, 75, 76 forms a respective metal trace 73 on the deposition substrate 23. By arranging the beam areas along a line 77 at an angle 79 with respect to the scanning direction 70, the metal line 74 can be repaired with no gaps between the metal traces 73 and without any optical interference effects due to beam area 71, 75, 76 overlap since the beam areas 71, 75, 76 are separated by a distance 78.

As shown in FIG. 7, the orientation of the beam areas 71, 75, 76 may result in metal being deposited upon a portion of a metal line that is not in need of repair outside the gap 72. This may result in a non-uniformity where this portion of the metal line is thicker than the portion in need of repair. This non-uniformity may be reduced by methods known to those skilled in the art such as by using a laser or by chemical-mechanical polishing (CMP).

As the beams are scanned along the gap 72 in the metal line 74, a second beam area 71 will impinge an area of the metallic material 26 adjacent the area impinged by an adjacent first beam area 75. In addition to ablation of the metallic material 26 in the area impinged by the first beam area 75, adjacent areas of the metallic material 26 may be delaninated from the donor plate 21. The second beam area 71 may then impinge metallic material 26 delaminated from the donor plate 21. This may result in non-uniformities in the deposited metal line.

Figure 8:
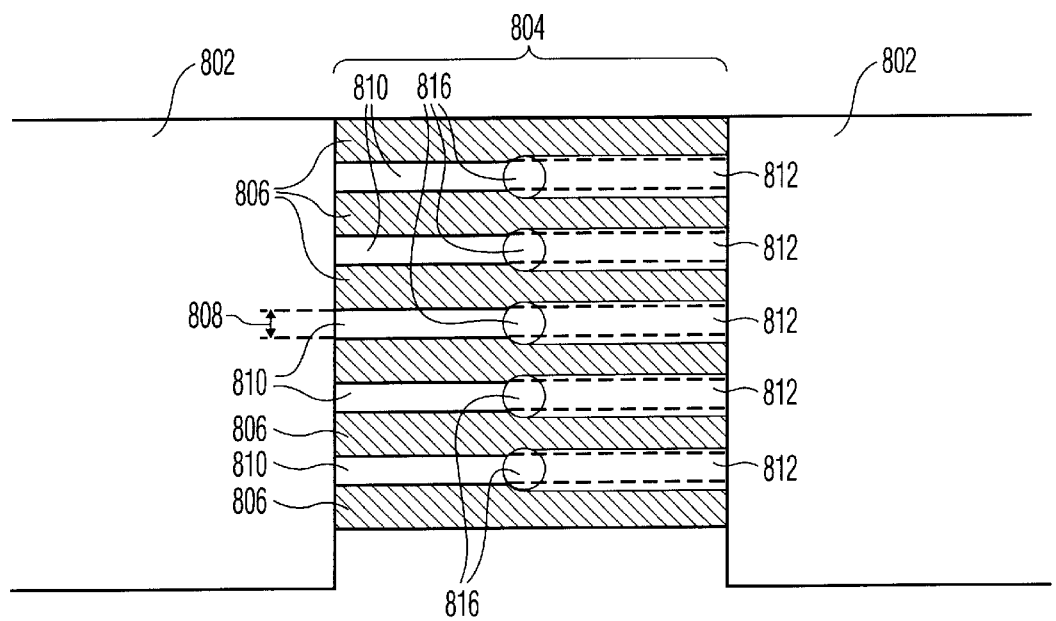

FIG. 8 shows an exemplary embodiment of the present invention which may be used to reduce non-uniform metal deposition due to delamination of metallic material 26 from a donor plate 21 as described above. As shown in FIG. 8, a metal line 802 has a gap 804 therein. A first focused plurality of beams is scanned to form metal traces 806. The metal traces 806 are separated from each other by a distance 808. This separation reduces non-uniformities due to delamination of the metallic material 26 from the donor plate 21, but results in gaps 810 in the repaired metal line.

As shown in FIG. 8, a second focused plurality of beams forms beam areas 816. The second focused plurality of beams may be scanned along the gap 1004 to fill the gaps 810 formed by the first plurality of beams. In an exemplary embodiment, before the second focused plurality of beams is scanned along the gap 804, the donor plate 21 is shifted so the beam areas 816 impinge on metallic material 26 that has not be ablated or delaminated from the donor plate 21.

The second focused plurality of beams may be scanned in the same or in a different direction than the first focused plurality of beams. The metal traces 812 deposited by the second focused plurality of beams may overlap the metal traces 806 deposited by the first focused plurality of beams as shown in FIG. 8. The metal traces 806 may also be adjacent the metal traces 812 or may be deposited to leave gaps between metal traces 806 and metal traces 812.

Figure 9:
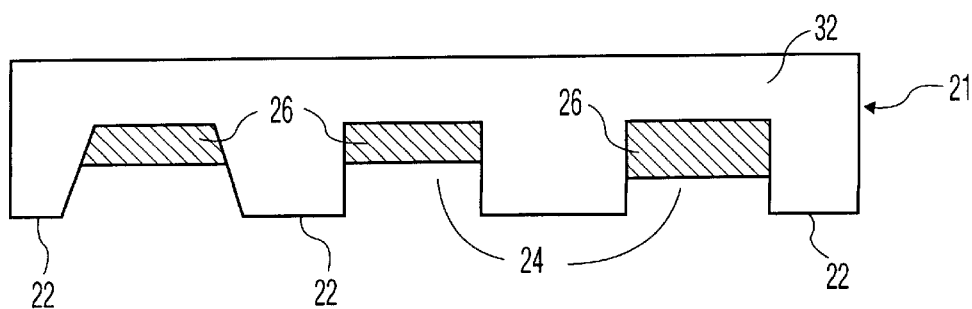
FIG. 9 shows a donor plate according to an exemplary embodiment of the present invention.

In an exemplary embodiment shown in FIG. 9, the donor plate 21 is formed with channels 24 in the donor surface 22 in which metallic material 26 is deposited. The plurality of focused parallel beams 17 may be arranged to impinge on the metallic material 26 within a channel 24 such that the channels 24 confine the metal ablated by the multiple beams.

Although an exemplary embodiment may describe the teachings of the present invention with respect to the repair of a metal line on a deposition substrate 23, the teachings of the present invention are applicable to both the repair and formation of metal lines on a deposition substrate 23.

Although the present invention is described above with reference to a plurality of beams, the teachings of this invention may be applied to metal line deposition using a single beam. For example, a single beam may be scanned along the metallic material to form a first metal trace. The donor plate may then be shifted such that a second scan of the single beam will impinge upon metal neither previously ablated nor previously delaminated. The second scan may form a second metal trace that overlaps, is adjacent to, or is away from the first metal trace.

Although this invention has been described with reference to a particular embodiment, it is not intended to be limited thereto. Rather, the scope of the invention is intended to be interpreted according to the scope of the appended claims.

What is claimed:

1. An apparatus for metal line deposition comprising:

a source of a plurality of non-overlapping coherent light beams; a donor plate having a donor substrate transparent to the plurality of coherent light beams and a donor surface coated with a metallic material;

a lens which focuses the plurality of coherent light beams along a first line on the metallic material to form a line of beams; and a deposition substrate having a deposition surface substantially parallel to the donor surface and disposed adjacent the donor surface of the donor plate; and means for actuating one of the donor plate and the deposition substrate with respect to the other;

wherein, the plurality of focused coherent light beams are conditioned to ablate the metallic material from the donor surface of the donor plate by discharging ions of the metallic material away from the donor plate and onto the deposition substrate to deposit a plurality of metal traces, wherein said plurality of traces are parallel to each other and overlap.

2. An apparatus for metal line deposition upon a deposition substrate having a deposition surface comprising:

a donor plate having a donor surface coated with a metallic material, the donor surface adjacent to and substantially parallel to the deposition surface;

a laser which provides a coherent light beam;

a diffraction element which converts the coherent light beam into a plurality of coherent light beams arranged along a first line on the metallic material to form a line of beams; and means for actuating the line of beams or the donor plate and the deposition substrate with respect to the other so the metallic material is ablated from the donor plate in a direction parallel to the metal line to be deposited.

3. The apparatus according to claim 2 further comprising means for applying an electric field between the donor plate and the deposition substrate.

4. The apparatus according to claim 2 wherein the diffraction element converts the coherent light beam into a plurality of coherent light beams wherein each of the plurality of coherent light beams has a beam area and no two of the plurality of coherent light beams overlap.

5. The apparatus according to claim 2 wherein the metallic material comprises one of copper, gold, aluminum and silver.

* * * * *